(12) United States Patent
Fedeli

(10) Patent No.: US 8,252,670 B2
(45) Date of Patent: Aug. 28, 2012

(54) PRODUCTION METHOD FOR A LATERAL ELECTRO-OPTICAL MODULATOR ON SILICON WITH AUTO-ALIGNED IMPLANTED ZONES

(75) Inventor: Jean-Marc Fedeli, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 172 days.

(21) Appl. No.: 12/579,086

(22) Filed: Oct. 14, 2009

(65) Prior Publication Data

US 2010/0099242 A1    Apr. 22, 2010

(30) Foreign Application Priority Data

Oct. 17, 2008   (FR) ...................... 08 57059

(51) Int. Cl.
 *H01L 21/265* (2006.01)
(52) U.S. Cl. ........ 438/513; 438/514; 438/517; 438/531; 257/E21.334; 385/3
(58) Field of Classification Search ........... 438/500–517
See application file for complete search history.

(56) References Cited

U.S. PATENT DOCUMENTS

| | | | |
|---|---|---|---|
| 5,302,547 A * | 4/1994 | Wojnarowski et al. ........ | 216/41 |
| 7,116,853 B2 | 10/2006 | Gunn et al. | |
| 7,251,408 B1 | 7/2007 | Gunn et al. | |
| 2003/0013242 A1 | 1/2003 | Lai et al. | |
| 2008/0124870 A1 | 5/2008 | Park | |

FOREIGN PATENT DOCUMENTS

| | | |
|---|---|---|
| GB | 2 373 370 A | 9/2002 |
| GB | 2 373 921 A | 10/2002 |
| WO | WO 2005/093480 A1 | 10/2005 |

OTHER PUBLICATIONS

Marris-Morini et al. "Low Loss and High Speed Silicon Optical Modulator Based on a Lateral Carrier Depletion Structure", Optics Express 20080107 Optical Society of America US, vol. 16, No. 1, Jan. 7, 2008, pp. 334-339 XP-002530622.

* cited by examiner

*Primary Examiner* — Mamadou Diallo
(74) *Attorney, Agent, or Firm* — Miles & Stockbridge P.C.

(57) ABSTRACT

The invention relates to a production method of a lateral electro-optical modulator on an SOI substrate, the modulator comprising a rib waveguide formed in the thin layer of silicon of the SOI substrate, the rib waveguide being placed between a doped region P and a doped region N formed in the thin layer of silicon, the rib waveguide occupying an intrinsic region of the thin layer, at least one doped zone P being formed in the rib and perpendicularly to the substrate. The method comprises masking steps of the thin layer of silicon to define therein the rib of the waveguide, etching of the rib, masking of the thin layer of silicon to delimit the parts to be doped P, doping of the parts to be doped P, masking of the thin layer of silicon to delimit the region to be doped N and doping of the region to be doped N. The masking steps utilizes a hard mask whereof the pattern defines the rib of the waveguide, the zone to be doped P in the rib of the waveguide and the limit of the doped region N relative to the rib of the waveguide.

8 Claims, 18 Drawing Sheets

US 8,252,670 B2

PRODUCTION METHOD FOR A LATERAL ELECTRO-OPTICAL MODULATOR ON SILICON WITH AUTO-ALIGNED IMPLANTED ZONES

TECHNICAL FIELD

The invention relates to the field of photonics on silicon. It relates to the production of an electro-optical modulator for modulating the intensity of a continuous source of high-frequency light. The present invention relates more particularly to production of a light modulator with wavelengths of optical telecommunications (greater than 1.2 μm) made entirely of silicon. The modulator according to the present invention can be integrated into an optical waveguide whereof the cross-section can be submicronic, and can function at high frequency (of the order of a few tens of GHz). The technology employed is compatible with microelectronic technology.

PRIOR ART

The expression "Photonics on Silicon" combines studies based on light guidance in guides with a strong index in nanometric dimensions on silicon wafers. The basic concept is to perform optical functions with high integration on silicon. An example of building blocks is laser constituting a light source with a specific wavelength. To modulate this source in intensity, the control current can be modulated directly, but this leads to limited operating frequencies and to variations in wavelength. A more effective solution is to add an electro-optical modulator which will modulate the intensity of the light signal to a continuous source well controlled in wavelength.

The document U.S. Pat. No. 7,251,408 discloses a lateral modulator on silicon formed by a PN junction centred at the middle of the rib of a waveguide. FIG. 1 of this document, reproduced in FIG. 1 of the annexed drawings, shows an optical modulator 100 constituted by a lateral diode 105 made in a waveguide 110 on a substrate 101. The substrate 101 is a SOI substrate comprising a silicon support 102, successively supporting a layer of silicon oxide (or layer of buried oxide) 103 and a thin layer of silicon 104. The waveguide 110 comprises the thin layer 104 and the rib 112. A diode is formed between the electric contacts 121 and 131. The vertical confinement of the optical wave occurs from the contrast optical existing in the layer of silicon 104, the layer of embedded oxide 103 and a layer of dielectric material deposited on the waveguide 110 and not shown in FIG. 1. The dotted line 111 represents the transversal section of the waveguide in which the majority of the power of the guided optical mode propagates. The diode 105 has two doped regions 120 and 130. The doping of the regions 120 and 130 are of opposite type. The two doped regions 120 and 130 are found at the junction PN 106 which is approximately the centre of the waveguide 110. Conductive pins 122 and 132 connect respectively to the doped regions 120 and 130 by means of electric contacts 121 and 131.

In the absence of applied voltage, the diode 105 has a relatively narrow carrier depletion region. Polarising the diode 105 inversely by voltage supplied by the generator 140 increases the width of the depletion zone in the diode 105, which causes a change in the effective refraction index of the waveguide 110 and phase offset of the optical wave propagating in the waveguide 110.

The document U.S. Pat. No. 7,116,853 proposes a lateral modulator on silicon, of the same type as that described hereinabove and the aim of which is to optimise the doping profile by gradual modulation of lateral doping.

FIGS. 11 and 12 of this document, reproduced respectively in the attached FIGS. 2 and 3, illustrate this optimisation of the doping profile of the diode. FIG. 2 shows a PN diode formed in the thin layer of silicon and constituted by two regions 920 and 930 doped by an opposite type of doping. The region 920 comprises an electric connection contact 921 with a conductive pad 922. The region 930 comprises an electric connection contact 931 with a conductive pad 932. The PN junction 906 results from the meeting of regions 920 and 930. The dashed line 907 represents the upper border of the active silicon region. The dotted line 911 shows the transversal section of the waveguide in which the majority of the power of the guided optical mode propagates. The region 920 comprises sections 920A, 920B, and 920C of the same doping but of concentration levels of different dopants. Similarly, the region 930 comprises sections 930D, 930E and 930F of the same doping but of concentration levels of different dopants.

FIG. 3 is a graph showing the concentrations in dopants of the doped regions 920 and 930. The x-axis of FIG. 3 reproduces the horizontal axis of FIG. 2. The y-axis of FIG. 3 reproduces the polarity and relative level of the concentration in dopants of the doped regions of FIG. 2. The point L on the x-axis represents the left border of the region 920 in FIG. 2. The point J on the x-axis represents the centre of the PN diode in FIG. 2. The point R on the x-axis represents the right border of the region 930 in FIG. 2. In FIG. 3, $P_{max}$ is the highest level of dopants of type P, in the section 920A, $P_{min}$ is the lowest level of dopants of type P, in the section 920B, and $P_{mid}$ is an average level of dopants of type P, in the section 920C. $N_{max}$ is the highest level of dopants of type N, in the section 930F, $N_{min}$ is the lowest level of dopants of type N, in the section 930D, and $N_{mid}$ is an average level of dopants of type N, in the section 930E.

The difficulty of this approach is in the precise localisation of the implanted sections relative to the centre of the rib given production tolerances.

The document WO-A-2005/093 480 discloses an electro-optical modulator made on a SOI substrate and constituted by a rib waveguide. The proposed structure comprises one or more vertical doping planes and doped lateral contact zones $N^+$ and $P^+$ and located on either side of the guide. This electro-optical modulator is represented in transversal section in FIG. 4. It is made from an SOI substrate 1 comprising a silicon support 2 successively supporting a layer of silicon oxide 3 (layer of embedded oxide) and a thin layer of silicon 4. To produce this modulator, a well is etched in the thin layer of silicon 4 by leaving a minimal thickness of silicon for the epitaxy repeat. The structure is then made by selective epitaxial growth of silicon. It comprises a doped $P^+$ region 5 and a doped $N^+$ region 6 made above the layer of buried oxide 3, between which is a region not intentionally doped 7 where the rib waveguide 8 is made. The assembly constitutes a PIN diode. The active zone of the diode is formed by a plurality of very thin layers of silicon 9 placed perpendicularly to the substrate, either doped $N^+$ or doped $P^+$. Polarisation voltage can be applied to the diode by means of metallic electrodes 10 and 11 formed respectively on the doped regions 5 and 6. Electric contact can be improved by formation of a nickel or platinum silicide. FIG. 4 shows a layer of silicide 12 formed between the doped region 5 and the electrode 10, and a layer of silicide 13 formed between the doped region 6 and the electrode 11.

This structure has been manufactured and is discussed in the article "Low-loss and high-speed silicon optical modulator based on a lateral carrier-depletion structure" by D. MARRIS-MORINI et al., Optics Express, vol. 16, No. 1, Jan. 7, 2008, pages 334 to 339.

Examples of advantages are operation under weak electric current and very rapid operation.

The article by D. MARRIS-MORINI et al., cited hereinabove proposes the electro-optical modulator represented in transversal section in FIG. 5. It is made from an SOI substrate 21 comprising a silicon support 22 supporting successively a layer of buried oxide 23 of 1 μm in thickness and a thin layer of silicon 24 of 300 nm in thickness. Out of this thin layer has been realized a doped P region 25 and a doped N region 26 between which is located an intrinsic region 27 where the rib waveguide 28 is made. The width of the rib is 660 nm and it projects above the doped regions N and P by 100 nm. The central zone 29 of the waveguide is doped P and occupies a width of 100 nm. This central zone 29 serves as a source for holes. The doped region 26 slightly borders on the right part of the rib and occupies a zone 30 there.

FIGS. 6A to 6G are views in transversal section partially illustrating the production method of such an electro-optical modulator according to the prior art.

FIG. 6A shows the layer of buried oxide 23 of an SOI substrate (the silicon support is not represented for simplification reasons) supporting the thin silicon layer 24. A fine layer of silicon oxide 31 is formed by thermal oxidation on the thin layer of silicon 24. To produce the rib of the waveguide, a resin mask 32 is made by lithography.

The regions not masked are etched, starting with the fine layer of oxide 31 then the thin layer of silicon 24. The rib 33 of the waveguide is produced as shown in FIG. 6B.

The resin mask is eliminated and the denuded parts of the thin layer of silicon 24 are subjected to thermal oxidation to cover them in a fine layer of silicon oxide 34 as shown in FIG. 6C.

A layer of resin 35 is then deposited on the structure obtained previously and lithographed to form a mask provided with a slot 36 just above the central part of the rib 33, as shown in FIG. 6D. Implantation of boron is carried out in the central part of the rib 33 via the slot 36 and the fine layer of oxide 31.

The resin is eliminated, resulting in the structure in FIG. 6E which shows a doped zone P 29 at the centre of the rib 33.

A fresh layer of resin is deposited on the previously obtained structure. This layer of resin is lithographed to produce the mask 37 shown in FIG. 6F. This mask does not cover a part located to the right of the rib 33 as well as the part of the thin layer of silicon 24 located to the right of the rib 33.

Phosphorous implantation of ions is performed in the unmasked parts of the layer of silicon 24, through fine layers of oxide 31 and 34. The result obtained is shown in FIG. 6G, after elimination of the resin. This figure shows the doped region N 26 terminating in a zone 30 on the right part of the rib 33.

The major defect to this process according to the prior art is the absence of alignment of the implanted zones with the rib of the waveguide. As formation of the rib waveguide 28 and the two doped zones 29 and 30 (see FIG. 6G) employ three distinct levels of masking, the precision to be obtained on alignment is extremely high. In the worst case, the implanted zones P (zone 29) and N (zone 30) are either very distant from one another, or very close. A first extreme case is represented in FIG. 7 where the doped zone P 29 is offset on the left part of the rib 27 and where the doped zone N is combined with the region 26. A second extreme case is represented in FIG. 8 where the doped zone P 29 is offset on the right part of the rib 27 and overlaps the doped zone N 30. In the latter case, the result is a PN diode and not a PIN diode. This uncertainty on the position of the zones 29 and 30 is very harmful at the level of performance reproducibility and encumbers the possibility of mass production where the greatest tolerance is preferred to boost yields.

The same statement applies also to the modulators disclosed in U.S. Pat. No. 7,251,408 and U.S. Pat. No. 7,116,853, where the aim is to centre the junction PN and control the width of the different doped zones.

GB-A-2 373 921 discloses a production method of a lateral electro-optical modulator on an SOI substrate, the modulator comprising a rib waveguide. This method comprises a masking step using a mask employing a hard mask for defining the rib of the waveguide.

SUMMARY OF THE INVENTION

To rectify the above problem, the present invention proposes a production method providing auto-alignment of the implanted parts N and P.

The aim of the invention is therefore a production method of a lateral electro-optical modulator on an SOI substrate, the modulator comprising a rib waveguide formed in the thin layer of silicon of the SOI substrate, the rib waveguide being placed between a doped region P and a doped region N formed in the thin layer of silicon, the rib waveguide occupying an intrinsic region of the thin layer, the doped region P, the intrinsic region and the doped region N constituting a PIN diode structure, at least one doped zone P being formed in the rib and perpendicularly to the substrate, the method comprising masking steps of the thin layer of silicon, using a hard mask (206) whereof the pattern defines therein the rib of the waveguide, making the rib by etching the thin layer of silicon, masking the thin layer of silicon to delimit the parts to be doped P, doping the parts to be doped P, masking the thin layer of silicon to delimit the region to be doped N and doping the region to be doped N, characterised in that due to the hard mask, said masking steps likewise define the zone to be doped P in the rib of the waveguide and define the limit of the doped region N relative to the rib of the waveguide.

Hard mask is understood to mean a mask made of a material which is not eliminated during the elimination of resin masks currently utilised in the technology.

The hard mask can be formed by etching a layer of hard mask material. This hard mask can be made of silica, titanium or silicon nitride.

Advantageously, the pattern of the hard mask has external edges which define the rib of the waveguide, an internal slot which defines the zone to be doped P in the rib of the waveguide, one of said external edges defining the limit of the doped region N relative to the rib of the waveguide.

According to a particular embodiment, the process comprises the following successive steps:

formation of a first resin mask on the hard mask, the first resin mask covering the slot of the hard mask and being recessed relative to the external edges of the hard mask which define the rib of the waveguide, etching of the unmasked parts of the thin layer of silicon to produce the rib of the waveguide, elimination of the first resin mask, formation of a second resin mask masking the parts of the structure not having to be doped P, the second resin mask comprising a slot whereof the edges are recessed relative to the edges of the slot of the hard mask, performing doping P of the unmasked parts of the thin layer of silicon, elimination of the second resin mask, formation of a third resin mask masking the parts of the structure not having to be doped N, the edge of the third resin mask to the side of the region to be doped N being recessed relative to the corresponding edge of the hard mask, performing doping N of unmasked parts of the thin layer of silicon, elimination of the third resin mask, elimination of the hard mask.

The doping N can be performed by ionic implantation according to an angle of 0° relative to a direction vertical to the SOI substrate. It can also be performed by ionic implantation according to an angle determined relative to a direction vertical to the SOI substrate so as to dope the flank of the rib of the waveguide adjacent to the doped region N. It can also be obtained by plasma implantation which isotropically creates an implanted zone of controlled depth in the silicon.

According to another particular embodiment, the process also comprises, between the etching step of the thin layer of silicon and the elimination step of the first resin mask, a complete etching step of the parts of the hard mask not masked by the first resin mask.

BRIEF DESCRIPTION OF THE DRAWINGS

The invention will be better understood and other advantages and particular features will emerge from the following description, given by way of non-limiting example, accompanied by the annexed drawings, in which.

DETAILED EXPLANATION OF EMBODIMENTS OF THE PRESENT INVENTION

Figure 1:
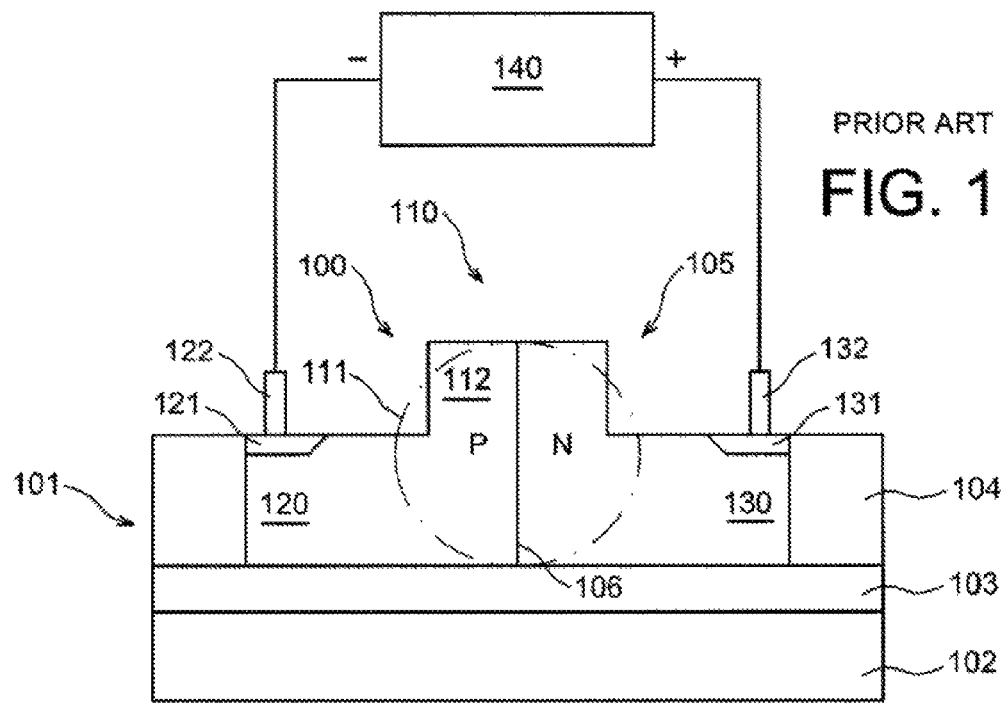
FIG. 1, already described, represents a lateral electro-optical modulator made on an SOI substrate, according to the prior art, FIGS. 2 and 3, already described, illustrate a method of optimising the doping profile of the lateral diode made in the rib of the waveguide for an electro-optical modulator according to the prior art, FIG. 4, already described, represents another lateral electro-optical modulator made on an SOI substrate, according to the prior art, FIG. 5, already described, represents yet another lateral electro-optical modulator made on an SOI substrate, according to the prior art, FIGS. 6A to 6G, already described, are views in transversal section partially illustrating the production process of the electro-optical modulator represented in FIG. 5, according to the prior art.
Figure 4:
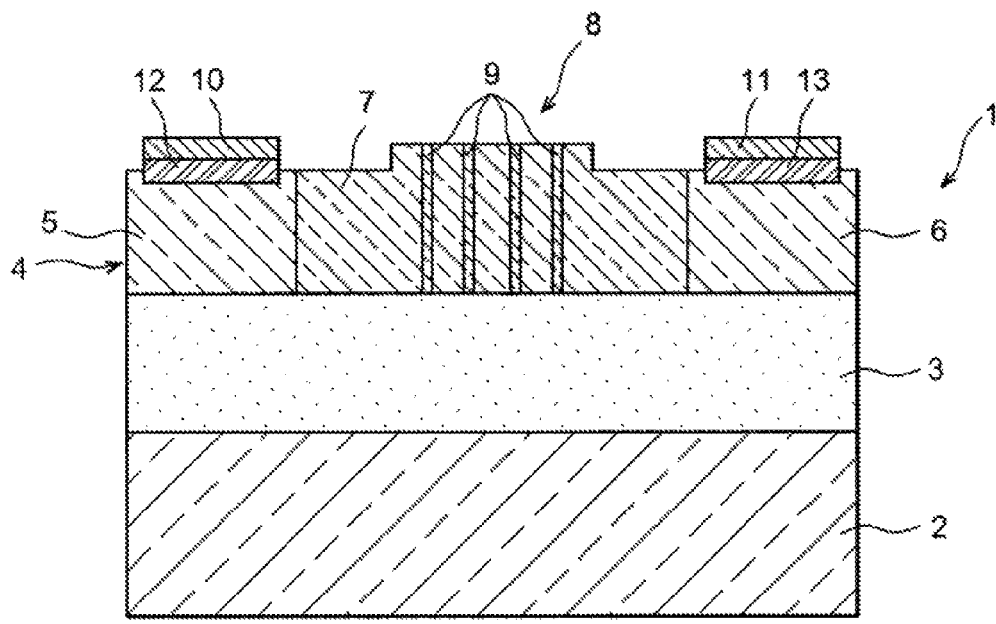
Figure 2:
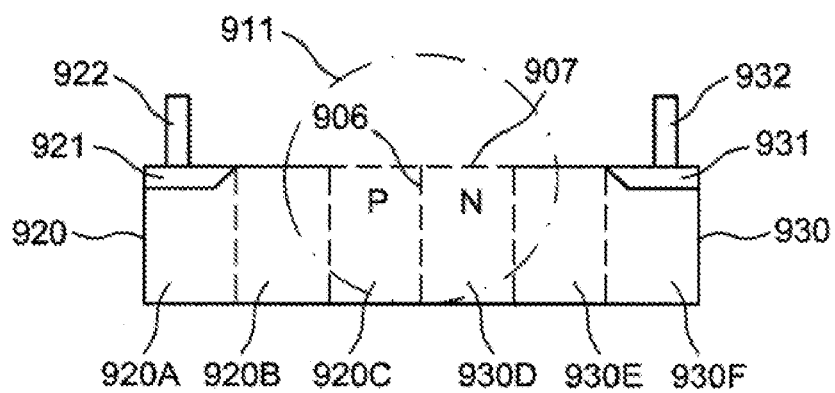
Figure 3:
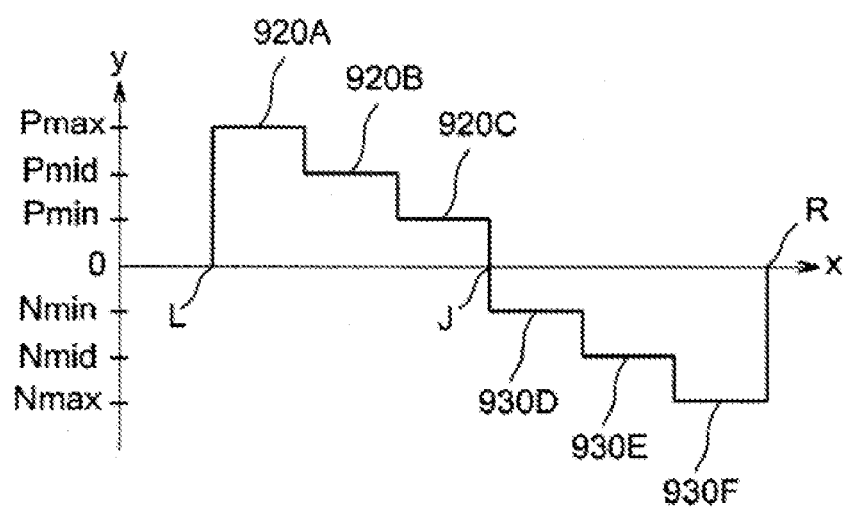

FIGS. 9A to 9J are views in transversal section illustrating a first embodiment of a lateral electro-optical modulator on silicon, according to the present invention.

The modulator is made on an SOI substrate comprising a silicon support (not shown for simplification reasons) supporting successively a layer of buried oxide 203 and a thin layer of silicon 204. A fine layer of silicon oxide 205 is formed successively on the thin layer of silicon 204, and, by LPCVD, a layer of silica 206 forming a hard mask (see FIG. 9A). This hard mask could also be made of titanium or silicon nitride. A resin mask 207 having a slot 208 for defining the doped zone P is formed on the hard mask 206 by lithography.

Figure 9A:
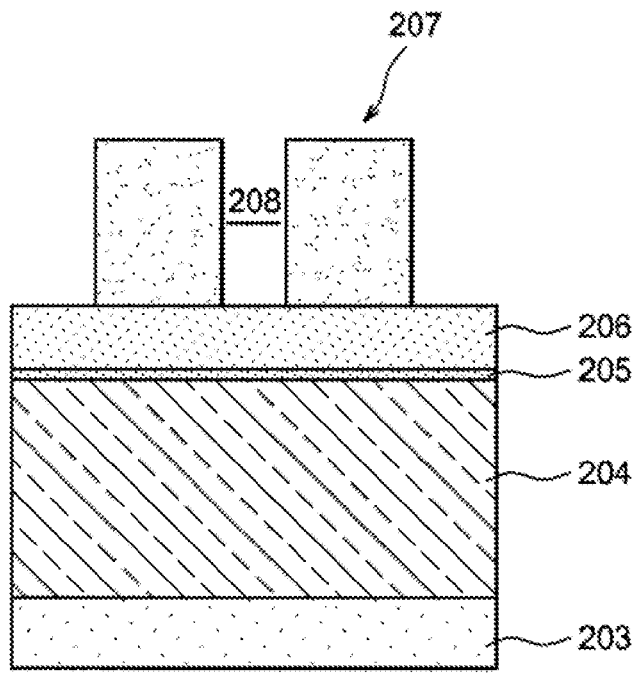
Figure 9B:
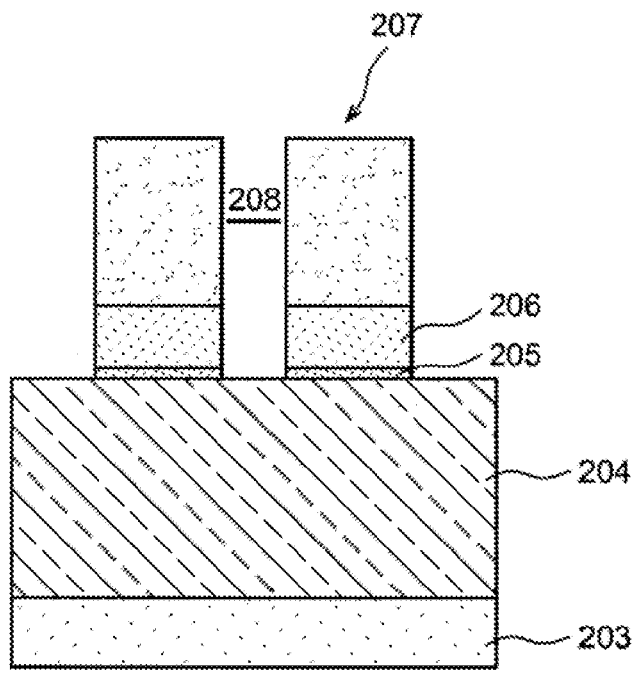

Etching of the unmasked parts of the hard mask 206 and of the fine layer of silicon oxide 205 is then conducted to reveal the thin layer of silicon 204 (see FIG. 9B).

Figure 9C:
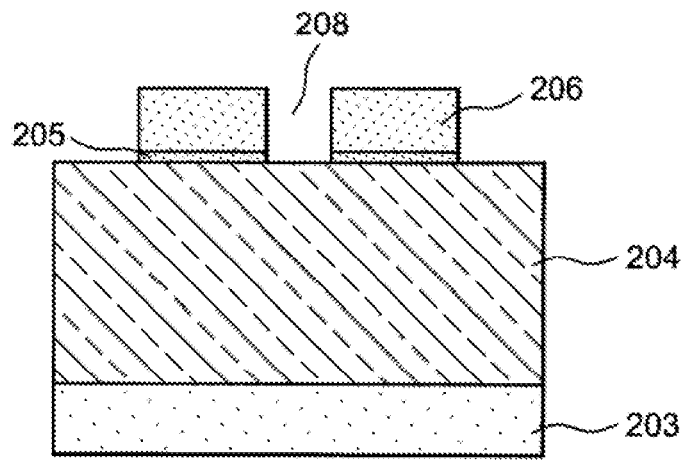

The resin mask is then eliminated as shown in FIG. 9C.

Figure 9D:
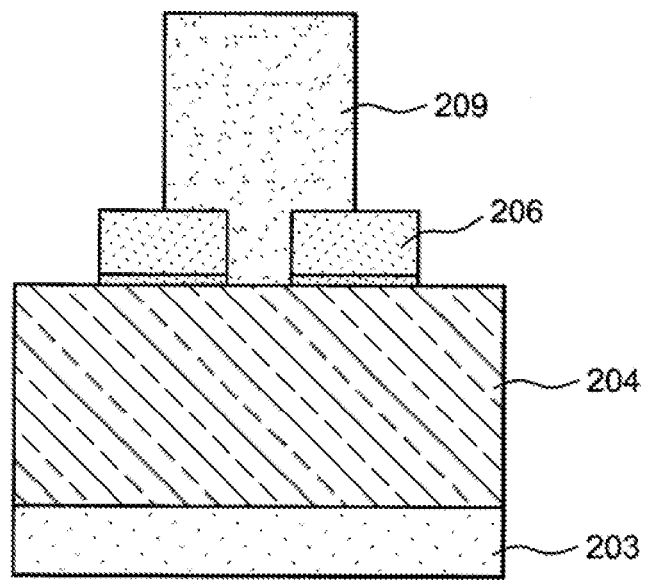

The next step is lithographic definition for protecting the slot 208 during the etching step of the rib of the waveguide. FIG. 9D shows the resulting lithography mask 209. The alignment tolerance of the lithography mask relative to the hard mask of silica 206 is $Ta=\pm(W-F)/4$. By way of example, $W=500$ nm, $F=100$ nm, therefore $Ta=\pm100$ nm.

Figure 9E:
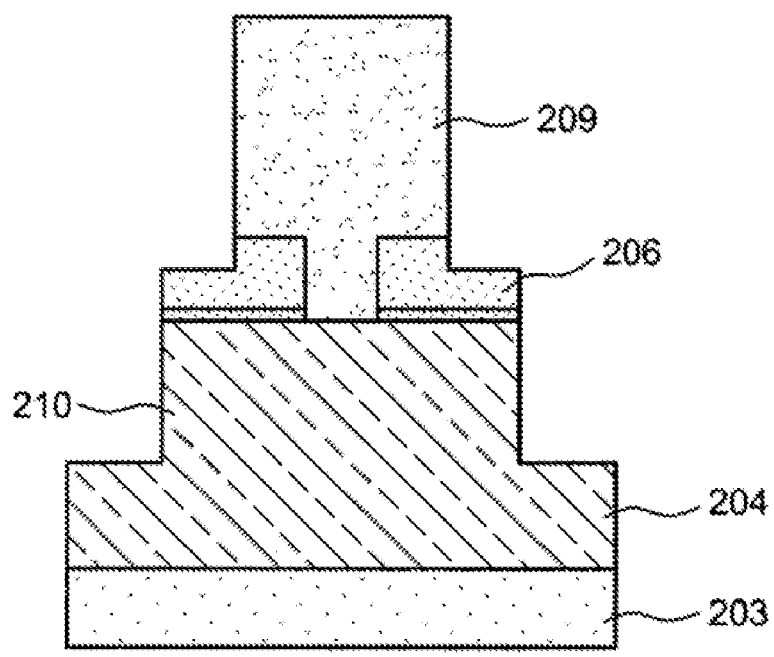

The structure obtained previously is subjected to an etching step of the silicon of the layer 204 to define the rib 210 necessary for optical guidance, as shown in FIG. 9E. During etching of the silicon, the hard mask 206 has been partially consumed in its part not masked by the lithography mask 209, which translates by a profile in step form.

Figure 9F:
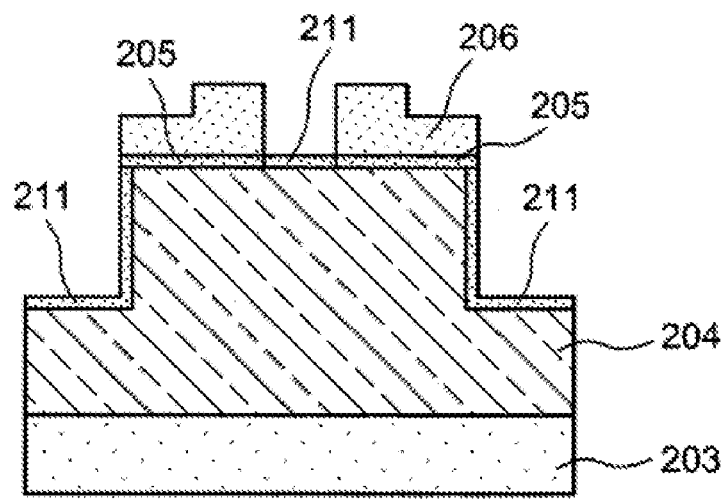
Figure 9G:
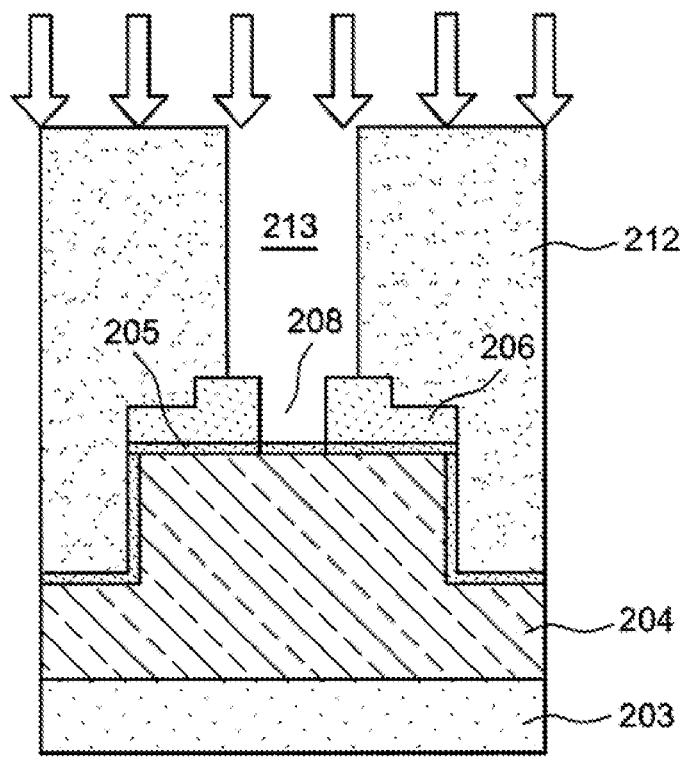

The resin mask 209 is then eliminated and a fine layer of silicon oxide 211 is formed on the thin layer of silicon 204 which was previously revealed, as shown in FIG. 9F.

Lithographic definition of the central implanted zone on the rib of the waveguide is then carried out. For this, a mask 212 having an opening 213 is formed (see FIG. 9G). The width of the opening 213 is greater than the width of the slot 208 such that it is the hard mask 206 which defines the width of the implanted zone. The width of the implanted zone is greater than $F+2$ Ta and less than $W-2$ Ta. The next step is formation of the doped zone P by implantation through the slot 208 (symbolised by arrows). Advantageously, the angle of implantation is 0° to reduce the lateral extension of the slot.

Figure 9H:
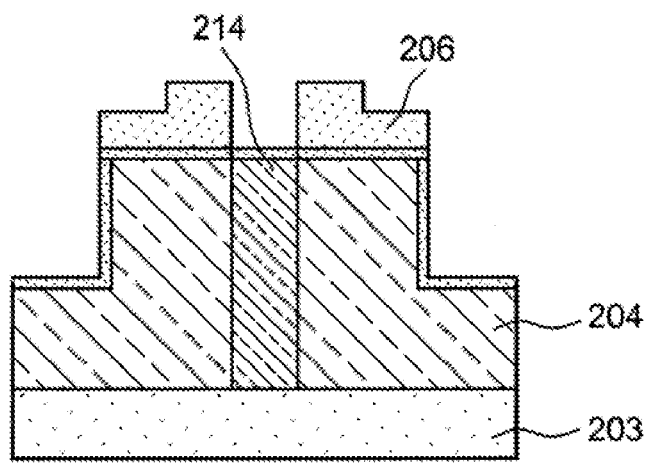

Implantation provides a doped zone P 214 perfectly centred relative to the rib 210 and the resin is eliminated (see FIG. 9H).

Figure 5:
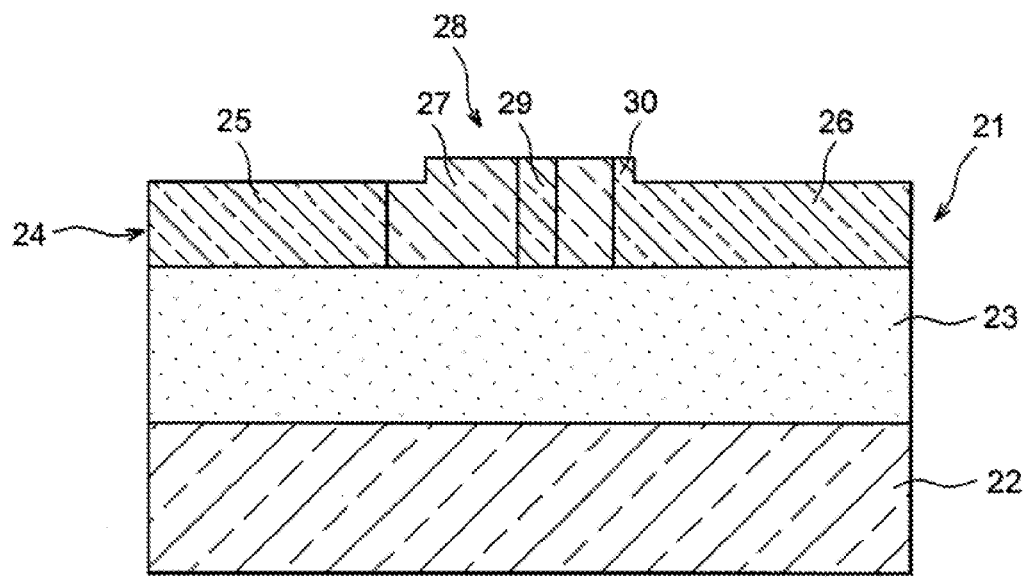
Figure 6A:
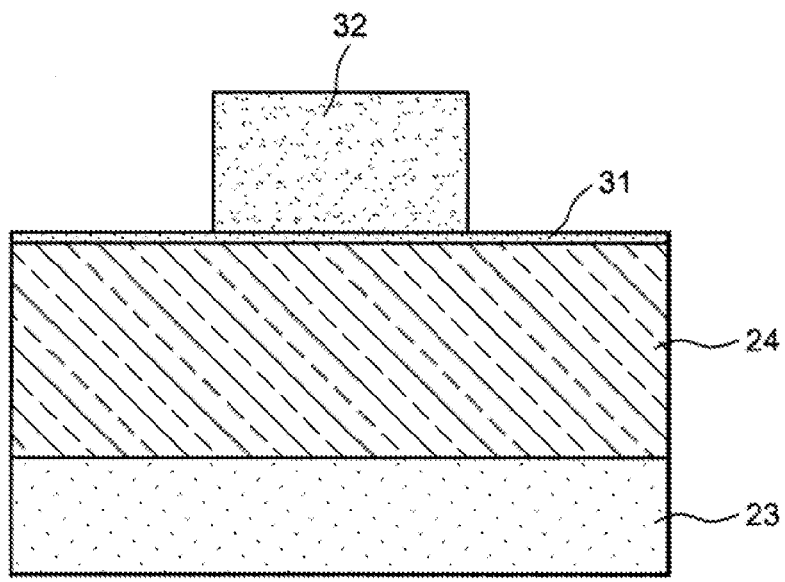
Figure 6B:
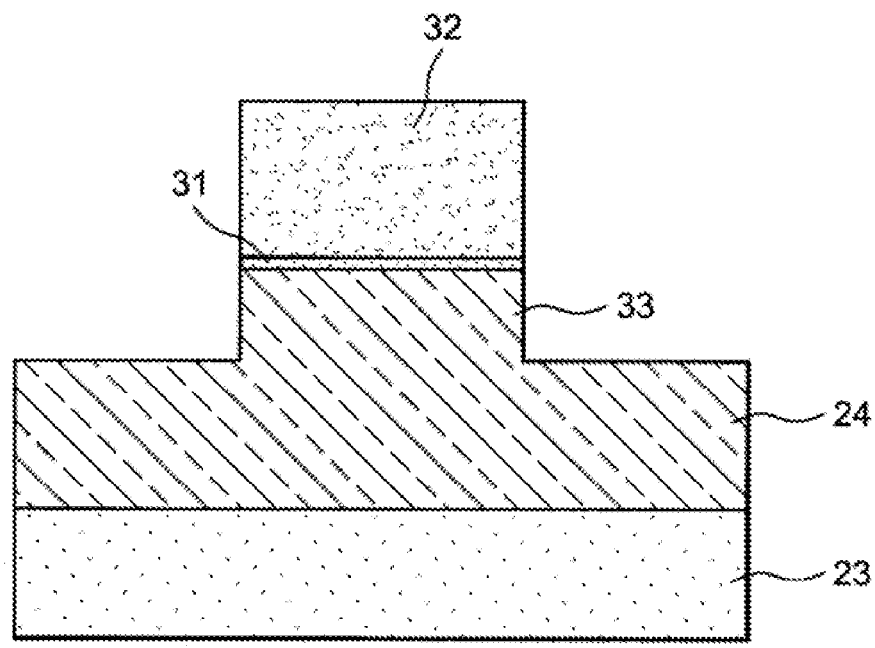
Figure 6C:
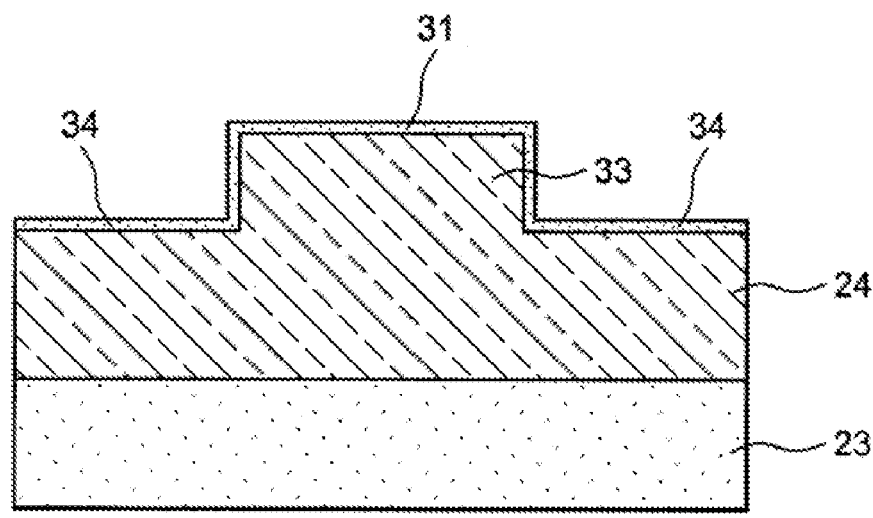
Figure 6D:
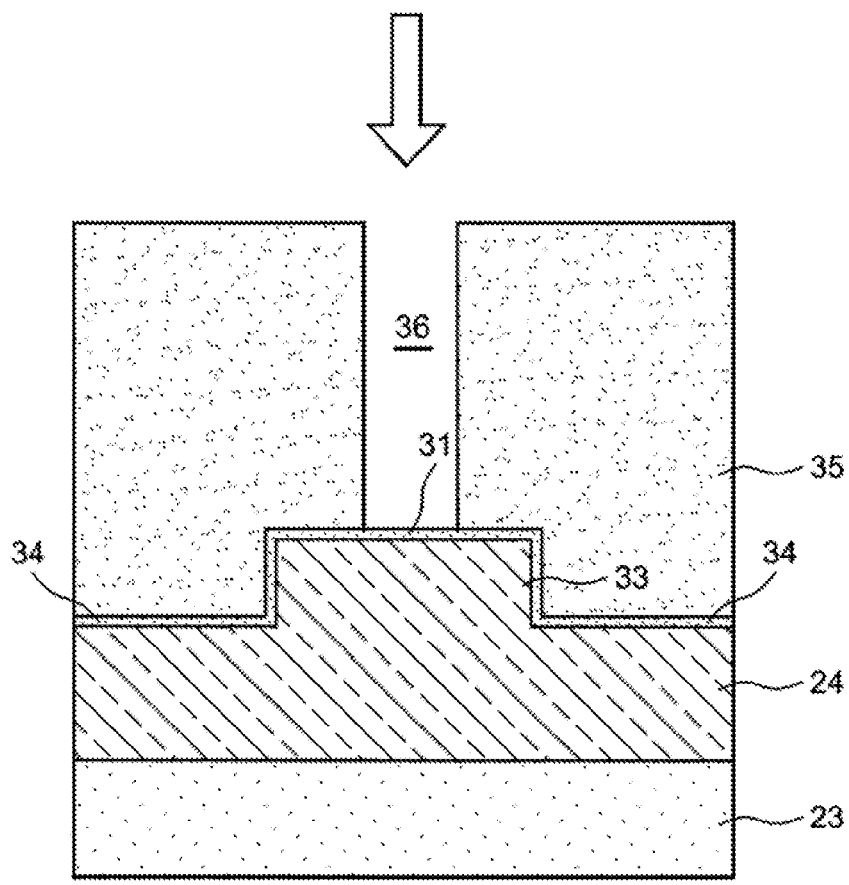
Figure 6E:
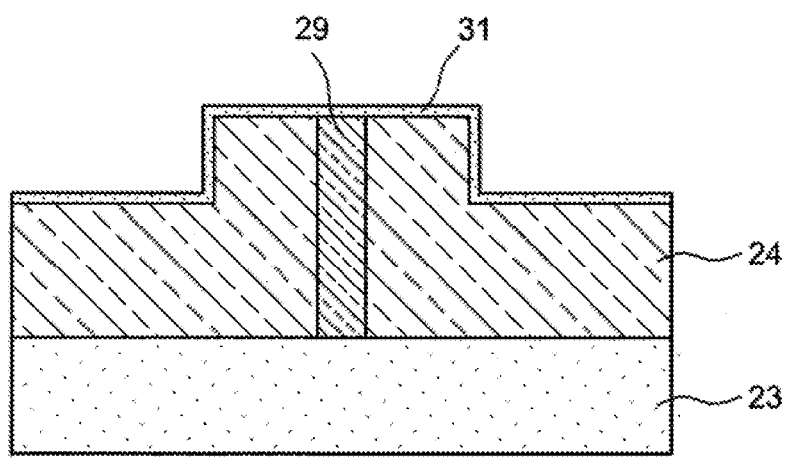
Figure 6F:
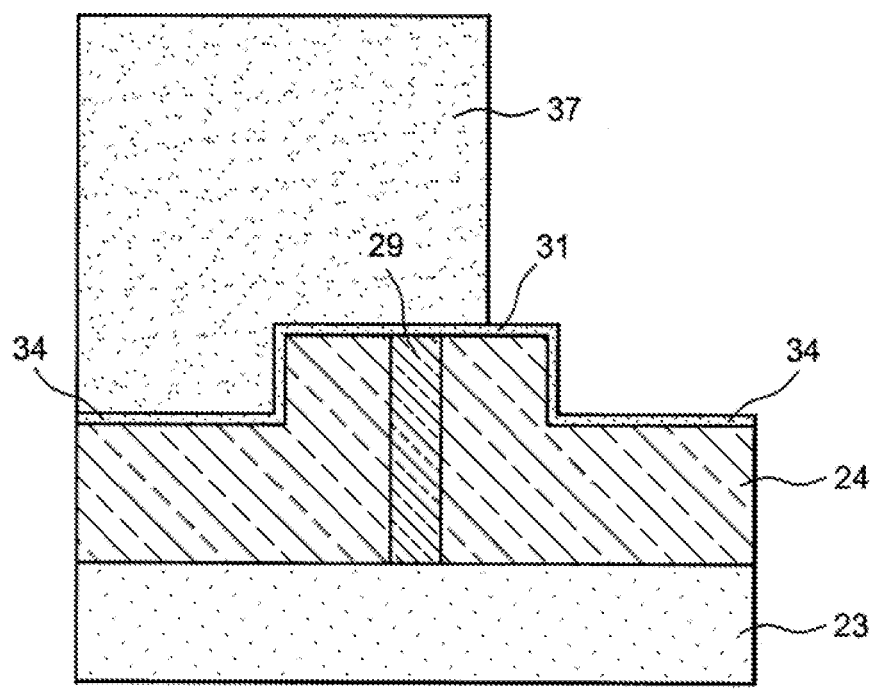
Figure 6G:
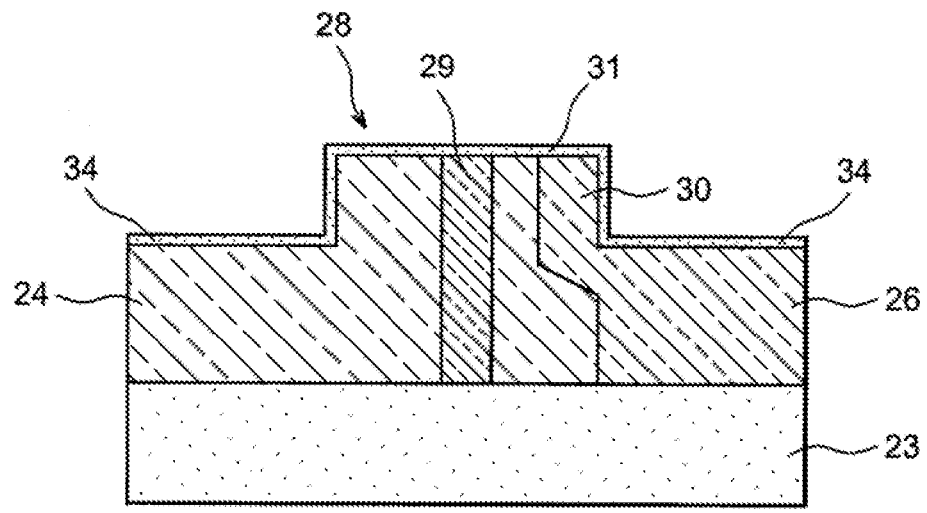
Figure 7:
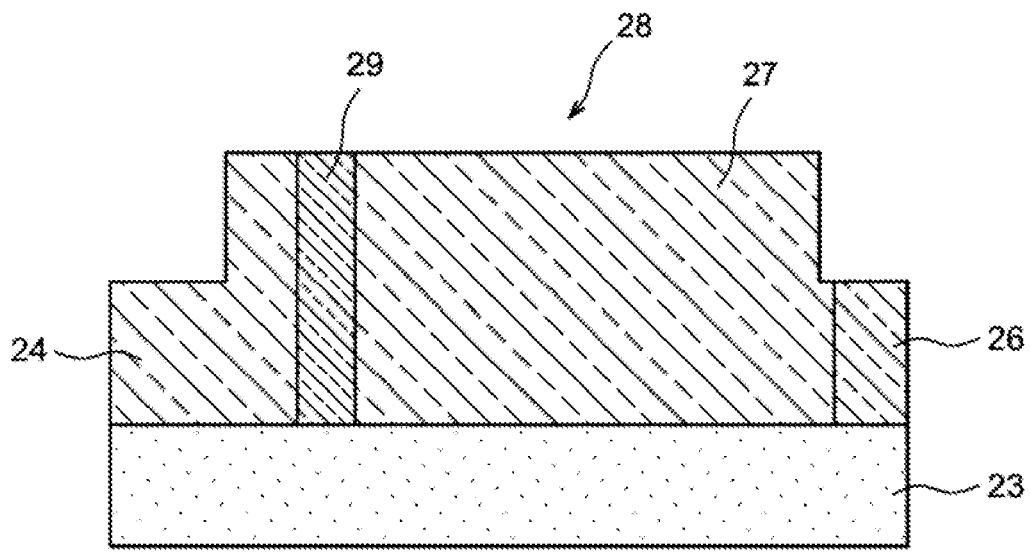
FIGS. 7 and 8 illustrate two extreme cases of absence of alignment of implanted zones relative to the rib of the waveguide for an electro-optical modulator made by the process illustrated by FIGS. 6A to 6G, FIGS. 9A to 9J are views in transversal section illustrating a first embodiment of a lateral electro-optical modulator on silicon, according to the present invention, FIGS. 9I' and 9J' are views in transversal section illustrating a variant of the first embodiment of a lateral electro-optical modulator on silicon, according to the present invention.
Figure 8:
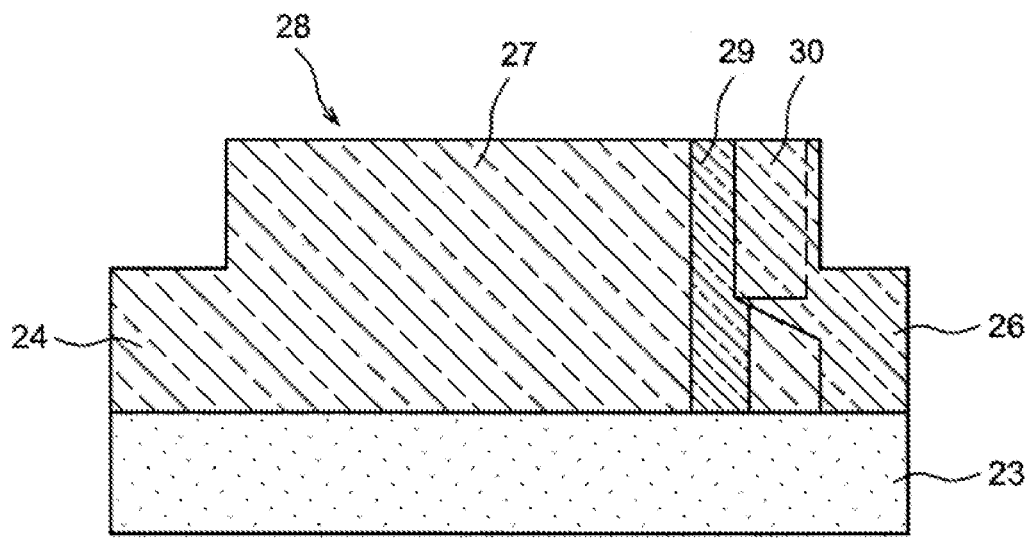

The doped region P corresponding to the region 25 of FIG. 5 is made during another masking level.

Figure 9I:
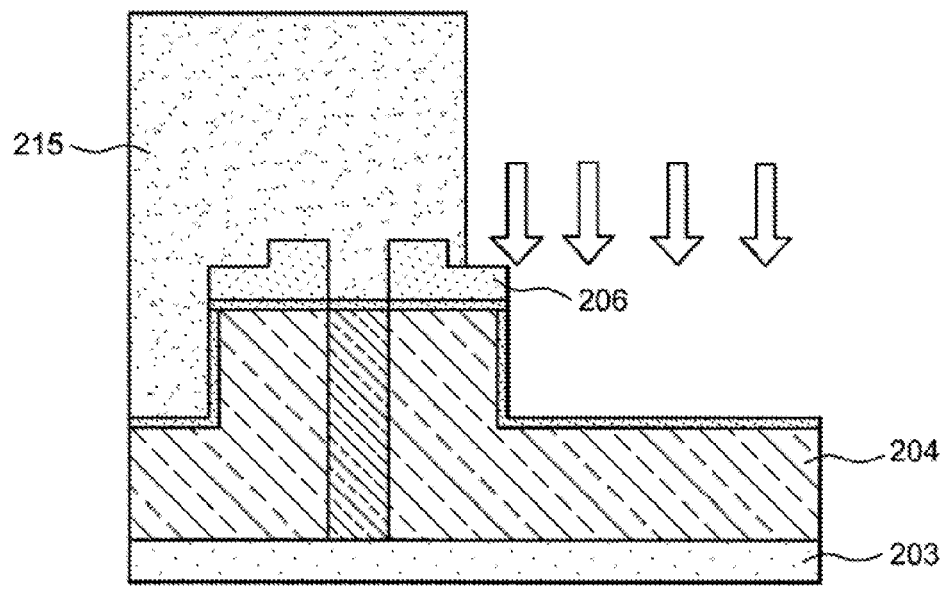

The next step is performing doping of the region N. For this, a mask 215 is formed by lithography on the parts to be protected of the structure obtained in FIG. 9H. This is illustrated by FIG. 9I which shows the mask 215 which leaves part of the hard mask 206 partially visible located to the side of the region to be implanted. Due to the presence of this hard mask, the alignment tolerance remains the same $Ta=\pm(W-F)/4$. In the case illustrated by FIG. 9I, implantation (symbolised by arrows) occurs with an angle of 0° on a depth at least equal to the thickness of silicon remaining above the layer of buried oxide 203 after etching of the rib (200 nm for example). In this case, the implanted region N is auto-aligned with the edge of the rib by the presence of the hard mask 206.

Figure 9J:
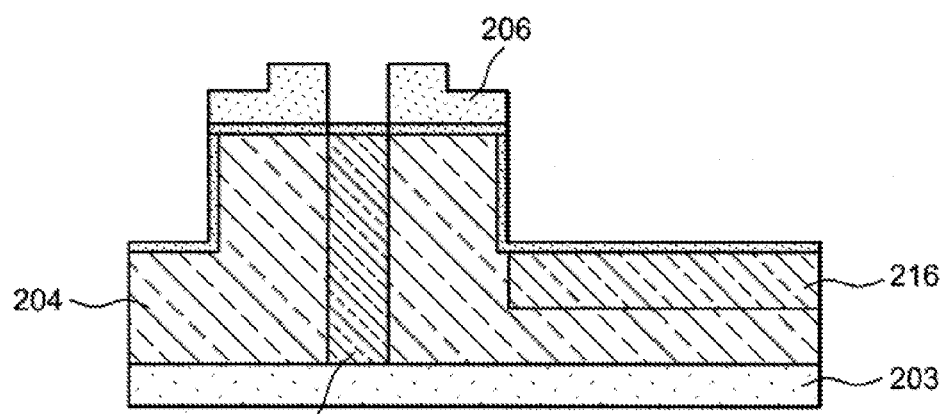
Figure 9I:
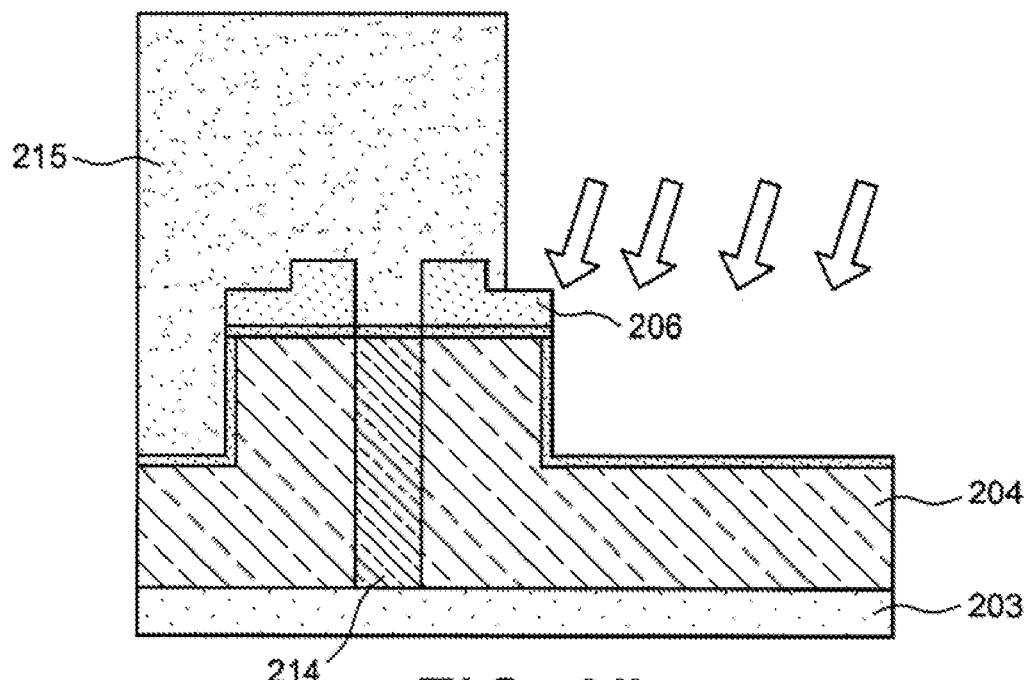
Figure 9J:
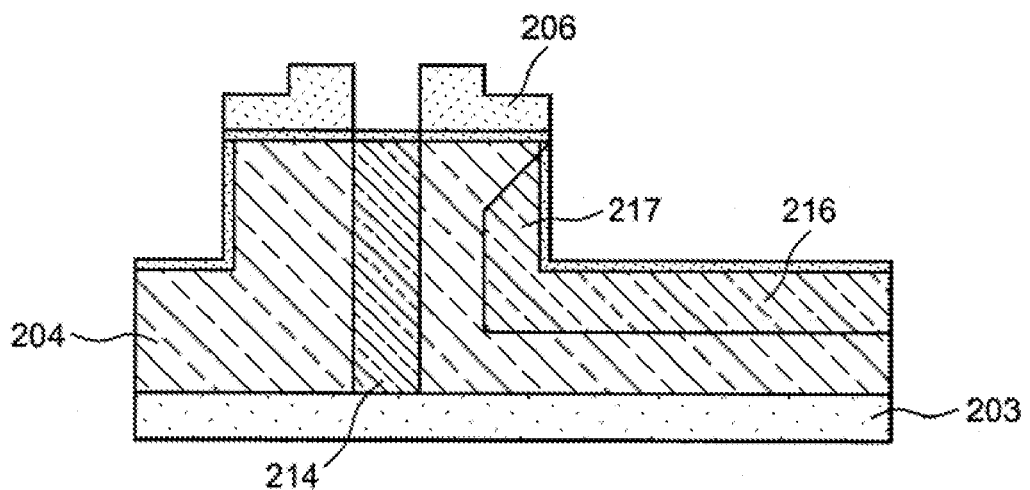

FIG. 9J shows the structure obtained after elimination of the resin mask. This figure shows the resulting doped region N 216. The hard mask 206 can then be eliminated, for example by chemical etching.

FIGS. 9I' and 9J' are views in transversal section illustrating a variant of the first embodiment. This variant embodiment is applied to the structure shown in FIG. 9H.

The same lithographic masking as for the embodiment described previously is employed. A mask 215 is therefore formed as for FIG. 9I. The difference relative to the previous embodiment is that ionic implantation is carried out with an angle different to 0°, for example 20°, for doping (for example on 100 nm in depth) the flank of the rib not masked as well as the access region. This effect can also be obtained by using plasma implantation. FIG. 9I' illustrates ionic implantation at a defined angle. FIG. 9J' shows the result obtained after elimination of the resin mask. Reference numeral 216 designates the doped region N as in FIG. 9J, and reference numeral 217 designates the doped zone N located on the flank of the rib.

Figure 10A:
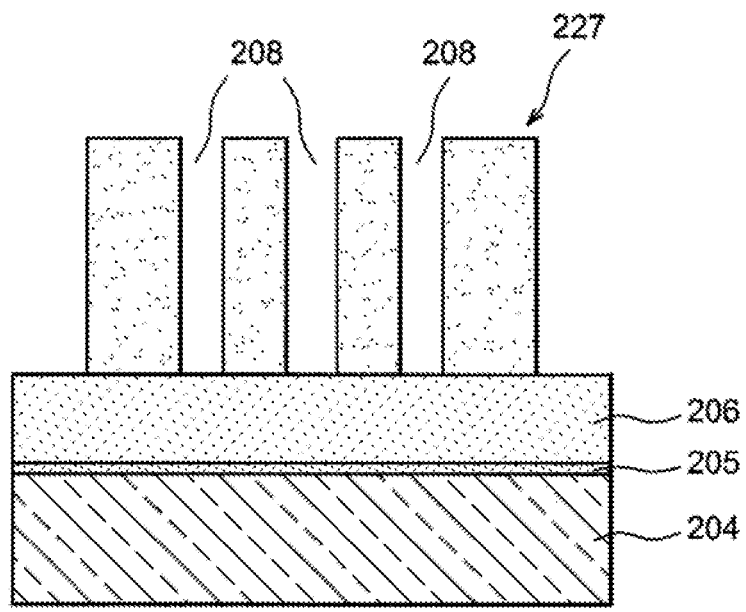
FIGS. 10A and 10B are views in transversal section illustrating, if needed be, a rib having several implanted zones of type P, according to the present invention.

If needed be, several zones can be implanted in the rib. For this, a resin mask 227 having several slots 228 to define doped zones P is formed by lithography on the starting structure constituted by an SOI substrate comprising (see FIG. 10A) a support, a layer of buried oxide (the support and the layer of oxide are not shown for simplification reasons) and a thin layer of silicon, covered by a fine layer of silicon oxide 205 and a layer of silica 206 forming a hard mask.

Figure 10B:
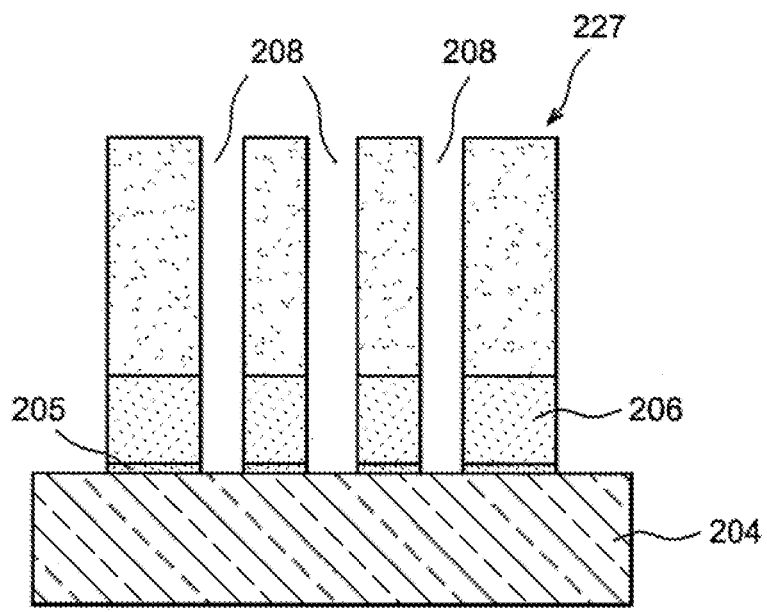

FIG. 10B corresponds to FIG. 9B. The unmasked parts of the hard mask 206 and of the fine layer of silicon oxide 205 are etched to reveal the thin layer of silicon 204. The rest of the process proceeds as previously described.

FIGS. 11A to 11G are views in transversal section illustrating a second embodiment of a lateral electro-optical modulator on silicon, according to the present invention.

The first steps of this second embodiment are identical to the first steps of the first embodiment. Therefore, they will not be illustrated by drawings.

Figure 11A:
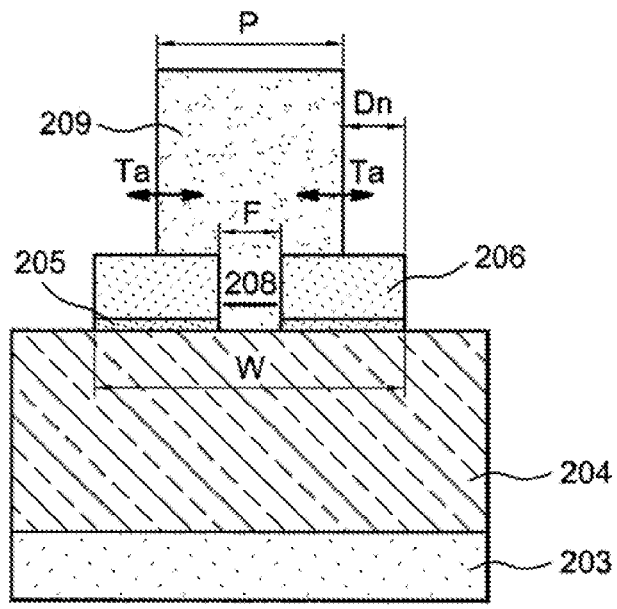
FIGS. 11A to 11G are views in transversal section illustrating a second embodiment of a lateral electro-optical modulator on silicon, according to the present invention.

FIG. 11A represents the structure during the same production stage as the structure shown in FIG. 9D. In this second embodiment, the pattern of the resin mask 209 protecting the slot 208 is defined with greater precision at the same time on its width and on its alignment to define the implanted zone N. The alignment tolerance of the resin mask 209 relative to the hard mask 206 is the best possible, therefore less than ±(W−F)/4. For example, if W=500 nm and F=100 nm, then Ta<100 nm. The width P of the resin mask 209 is:

$$F+2Ta<P<W-2Ta-Dn$$

where Dn is the desired width of the zone N on the rib of the waveguide.

Figure 11B:
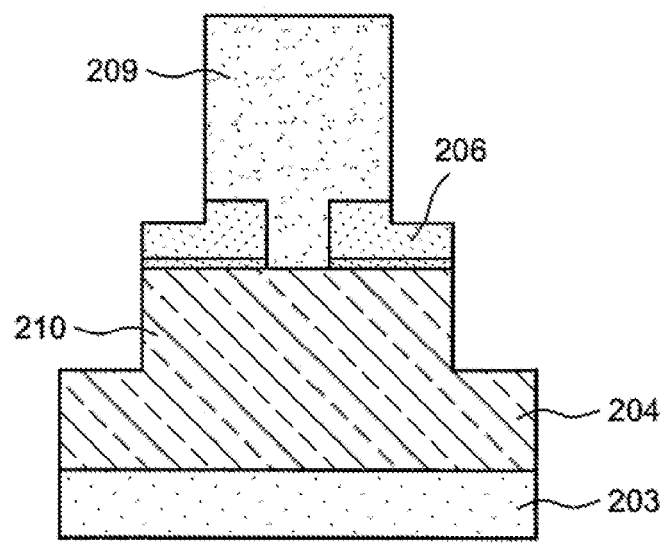

The structure obtained previously is subjected to an etching step of the silicon of the layer 204 to define the rib 210 necessary for optical guidance, as shown in FIG. 11B. During etching of the silicon, the hard mask 206 has been partially consumed in its part not masked by the lithography mask 209, which translates by a profile step form.

Figure 11C:
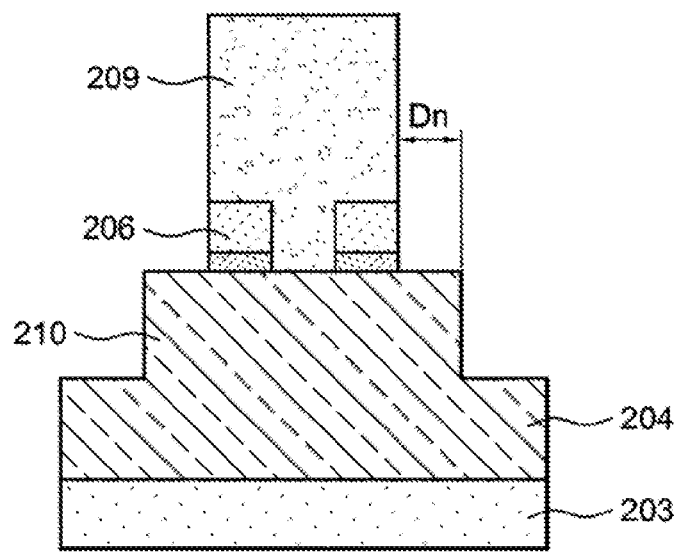

In reusing the resin mask 209, the next step is etching of the unmasked part of the hard mask 206, as shown in FIG. 11C. This step defines the extension of the doped zone N by width Dn.

Figure 11D:
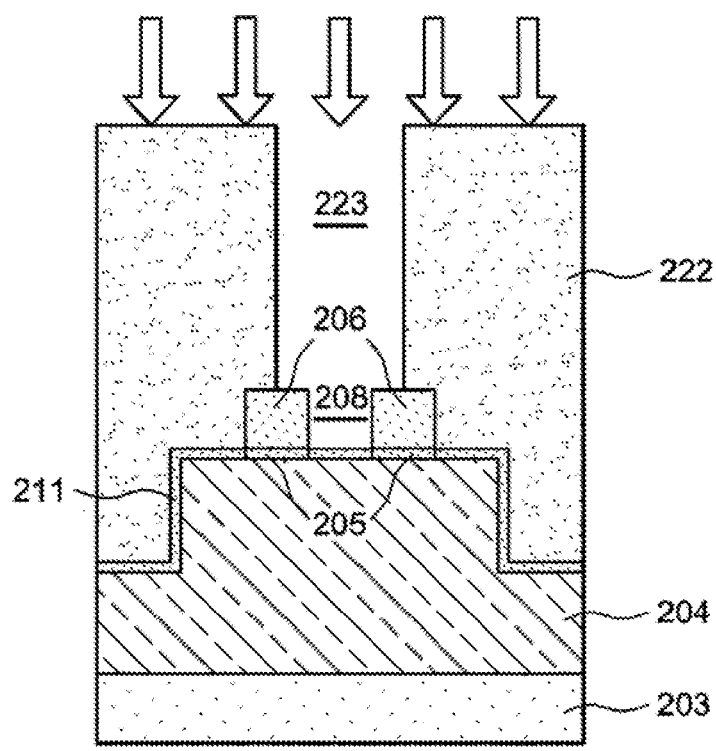

The resin mask 209 is then eliminated and a fine layer of silicon oxide 211 is formed on the thin layer of silicon 204 which has been previously revealed, as shown in FIG. 11D. Lithographic definition of the central implanted zone is then conducted on the rib of the waveguide. For this, a mask 222 having an opening 223 is formed (see FIG. 11D). The width of the opening 223 is greater than the width of the slot 208 such that it is the hard mask 206 which defines the width of the implanted zone. The width of the opening 223 as well as the alignment tolerance are more precise (for example, decrease by a factor of 2 on Ta). The next step is formation of the doped zone P by implantation through the slot 208 (symbolised by arrows). Advantageously, the angle of implantation is 0° to reduce the lateral extension of the slot.

Figure 11E:
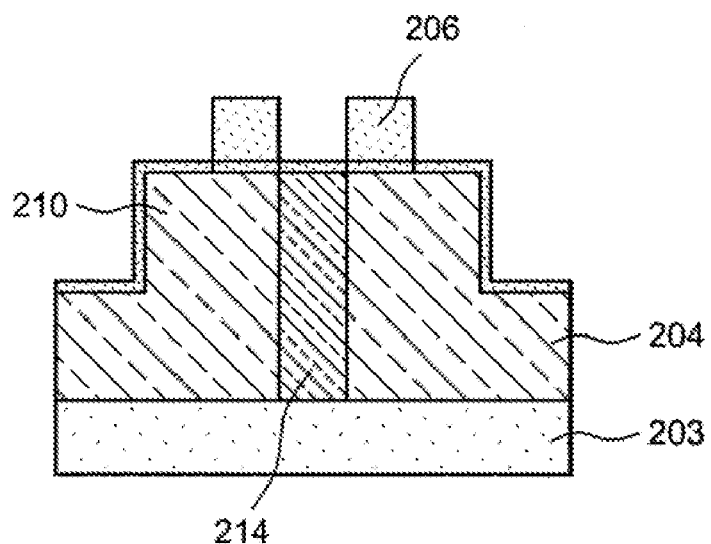

Implantation provides a doped zone P 214 perfectly centred relative to the rib 210 and the resin is eliminated (see FIG. 11E).

The doped region P corresponding to the region 25 of FIG. 5 is produced consequently.

Figure 11F:
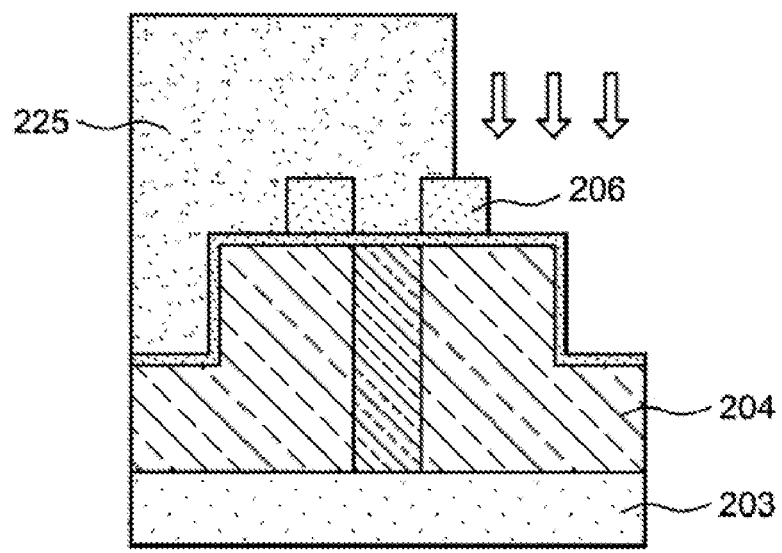

Doping of the region N will then be performed. For this, a mask 225 is formed by lithography on the parts to be protected of the structure obtained in FIG. 11E. This is illustrated by FIG. 11F which shows the mask 225 which leaves part of the hard mask 206 partially visible located to the side of the region to be implanted. Due to etching of the hard mask 206 (see FIG. 11C), the alignment tolerance of the resin mask 225 relative to the hard mask 206 is Ta=±(W−F)/8. By way of example, W=500 nm, F=10 nm and Ta=±50 nm. The alignment tolerance is identical to that for implantation of the slot, preferably at 0°.

In the case illustrated in FIG. 11F, implantation (symbolised by arrows) is done at a depth at least equal to the thickness of silicon remaining above the layer of buried oxide 203 after etching of the rib (200 nm for example).

Figure 11G:
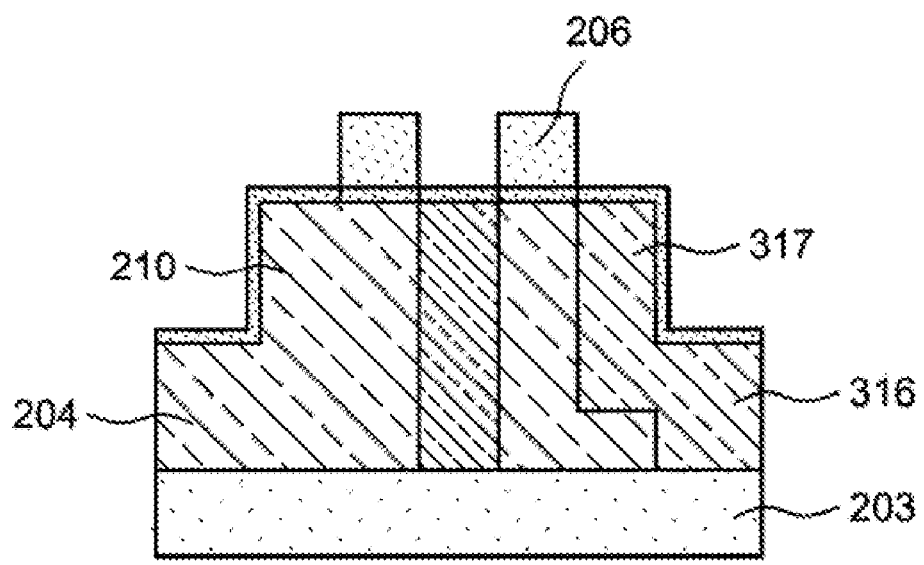

FIG. 11G shows the structure obtained after elimination of the resin mask. This figure shows the doped region N 316 obtained and which extends into the rib of the waveguide 210 via a doped zone N 317. The hard mask 206 can then be eliminated.

The invention claimed is:

1. A production method for a lateral electro-optical modulator on an SOI substrate, the modulator comprising a rib waveguide formed in a thin layer of silicon of the SOI substrate, the rib waveguide being placed between a doped region P and a doped region N formed in the thin layer of silicon, the rib waveguide occupying an intrinsic region of the thin layer, the doped region P, the intrinsic region, and the doped region N constituting a PIN diode structure, at least one doped zone P being formed in a rib of the waveguide and perpendicular to the substrate, the method comprising:

masking steps of the thin layer of silicon using a hard mask having a pattern that defines therein the rib of the waveguide, said pattern of the hard mask having an internal slot which defines said at least one zone to be doped P in the rib of the waveguide, and external edges which define a limit of a zone to be doped N relative to the rib of the waveguide;

producing the rib by etching the thin layer of silicon, said rib being defined by the pattern of the hard mask;

masking the thin layer of silicon to delimit a region to be doped P;

doping the region to be doped P, said region to be doped P being defined by the internal slot of the hard mask;

masking the thin layer of silicon to delimit a region to be doped N; and doping the region to be doped N, a limit of the region to be doped N being defined the external edges of the hard mask.

2. The method as claimed in claim 1, wherein the hard mask is formed by etching of a layer of hard mask material.

3. The method as claimed in claim 1, wherein the hard mask is made of a material selected from silica, titanium and silicon nitride.

4. The method as claimed in claim 1, further comprising:

forming a first resin mask on the hard mask, the first resin mask covering the slot of the hard mask and being recessed relative to the external edges of the hard mask which define the rib of the waveguide;

etching the unmasked parts of the thin layer of silicon to produce the rib of the waveguide;

eliminating the first resin mask;

forming a second resin mask masking the parts of the structure not having to be doped P, the second resin mask comprising a slot having edges which are recessed relative to the edges of the slot of the hard mask;

performing the doping P of the unmasked parts of the thin layer of silicon;

eliminating the second resin mask;

forming a third resin mask masking the parts of the structure not having to be doped N, the edge of the third resin mask to the side of the region to be doped N being recessed relative to the corresponding edge of the hard mask;

performing the doping N of the unmasked parts of the thin layer of silicon;

eliminating the third resin mask; and eliminating the hard mask.

5. The method as claimed in claim 4, wherein the doping N is performed by ionic implantation according to an angle of 0° relative to a direction vertical to the SOI substrate.

6. The method as claimed in claim 4, in which the doping N is performed by ionic implantation according to an angle determined relative to a direction vertical to the SOI substrate so as to dope the flank of the rib of the waveguide adjacent to the doped region N.

7. The method as claimed in claim 4, wherein the doping N is performed by ionic implantation of plasma type for doping the flank of the rib of the waveguide adjacent to the doped region N.

8. The method as claimed in claim 4, further comprising:
between the etching step of the thin layer of silicon and the elimination step of the first resin mask, a complete etching step of the parts of the hard mask not masked by the first resin mask.

* * * * *